United States Patent [19]

Hashemi et al.

[11] Patent Number: 4,864,540

[45] Date of Patent: Sep. 5, 1989

[54] BIPOLAR RAM HAVING NO WRITE RECOVERY TIME

[75] Inventors: A. David Hashemi, Santa Clara; Robert M. Reinschmidt, Losgatos, both of Calif.

[73] Assignee: Digital Equipment Corporation, Maynard, Mass.

[21] Appl. No.: 155,022

[22] Filed: Feb. 11, 1988

[51] Int. Cl.[4] .................. G11C 11/34; G11C 7/00
[52] U.S. Cl. .................... 365/179; 365/190; 365/155
[58] Field of Search ............. 365/155, 179, 189, 230, 365/203, 190, 156

[56] References Cited

U.S. PATENT DOCUMENTS 4,387,445  6/1983  Denis et al. ................ 365/179

Primary Examiner—Joseph A. Popek
Attorney, Agent, or Firm—Finnegan, Henderson, Farabow, Garrett & Dunner

[57] ABSTRACT

A bipolar random access memory having no write recovery time. During a data write operation, while the memory state of the memory cell is being shifted, a data bypass circuit sets a sense latch in the sense amplifier to store the new state to which the memory cell is being set. To prevent the sense latch from being shifted by transient write recovery currents charging bit line parasitic capacitances following the data write operation, a read/write transmission circuit isolates the sense amplifier from the bit lines, diverts current from the sense amplifier to a source of high voltage to charge the parasitic capacitances, and then realigns the sense amplifier to the bit lines.

7 Claims, 4 Drawing Sheets

BIPOLAR RAM HAVING NO WRITE RECOVERY TIME

BACKGROUND OF THE INVENTION

I. Field of the Invention

This invention relates to solid state computer memory circuits and in particular to bipolar random access memories.

II. Background Information

Bipolar Random Access Memories (bipolar RAMs) are devices implemented in bipolar technology which store and recall information in binary form. The information can be stored or recalled in any order at the user's discretion (at random). Although conventional bipolar RAMs are widely used throughout the computer industry, the speed of operation is unacceptably slow for certain applications. This speed problem can be better appreciated through an understanding of the operation of a conventional bipolar RAM.

The basic element for data storage in a bipolar RAM is a memory cell, which is a bi-stable latch. Memory cells are physically placed in a rectangular array and connected by pairs of metal conductors called word lines and bit lines. A particular memory cell in the array is selected for data retrieval (a read operation) or data storage (a write operation) by selecting one particular pair of word lines and one particular pair of bit lines.

FIG. 1 shows a conventional bipolar RAM 10 which contains one memory cell 12. Memory cell 12 comprises two cross-coupled silicon controlled rectifiers (SCRs). An SCR is shown schematically as a PNP transistor and a dual emitter NPN transistor connected such that the base of the PNP is connected to the collector of the NPN and the base of the NPN is connected to the collector of the PNP. By cross-coupling the two SCRs (connecting the NPN collector and base nodes of one SCR correspondingly to the base and collector nodes of the other SCR) a bi-stable latch is constructed. The two stable states are represented by either one SCR or the other SCR conducting current.

Memory cell 12 has 4 external terminals and two internal nodes. The PNP emitters are connected together and to upper word line 18. Two NPN emitters from different SCRs are connected together and to lower word line 19. Two NPN emitters, one from each SCR are each connected to a bit line which together form a bit line pair 14 and 15. The internal memory cell nodes are nodes 16 and 17. Node 16 connects the base of NPN transistor 28' to the base of PNP transistor 29 and node 17 connects the base of NPN transistor 28 to the base of PNP transistor 29'.

Upper word line 18 is driven by an emitter follower (not shown). Connected to the lower word line 19 is a constant current sink which supplies current to memory cell 12 to maintain the bi-stable state of memory cell 12 when not selected. Memory cell 12 is selected by forcing a high voltage on upper word line 18 (selecting the row) and simultaneously turning on switchable current sinks 11 and 13 (selecting the bit line). When cell 12 is selected, read or write operations can be performed on memory cell 12.

Referring to memory cell 12, a "1" state can be defined when the voltage at node 17 is high and the voltage at node 16 is low. Correspondingly a "0" state is when the voltage at node 16 is high and the voltage at node 17 is low. During a read operation, memory cell 12 is selected and signals RD and $\overline{RD}$ are set to a read threshold voltage which is designed to be a voltage approximately midway between the voltages at the internal nodes 16 and 17 of the selected cell. In the read mode, if memory cell 12 is in the "1" state, node 17 is high (higher than $\overline{RD}$) and the right side of memory cell 12 conducts current to current sink 13. Transistor 25 is off. Node 16 is low (lower than RD) and the left side of memory cell 12 is off. Transistor 24 conducts current to current sink 11. Since transistor 25 is off, only "keep alive" current is flowing through transistor 27.

Transistor 24 is on and its collector current plus a keep alive current is flowing through transistor 26. Transistor 26 is conducting more current than transistor 27 which creates a voltage difference at the collector nodes of transistors 26 and 27. This voltage difference indicates the state of selected memory cell 12 and is amplified and transmitted to the output to produce a logic "1" level corresponding to the state of selected memory cell 12. In a similar manner when the selected memory cell contains a "0" state, the corresponding logic "0" state will be transmitted to the output.

A write operation results in selected memory cell 12 being in a particular state corresponding to the data input. If selected memory cell 12, before writing, is in the opposite state of the input data, its state will be altered to correspond to the input data. If the state of selected memory cell 12, before writing, is already in the same state as the input data, its state will not be altered.

Referring to FIG. 1, a write "1" operation will be explained. Before a write operation, circuit 10 is in a read mode. In this mode both RD and $\overline{RD}$ are set to a read threshold voltage. To write a "1" to selected memory cell 12, voltage $\overline{RD}$ is lowered until its voltage is lower than the lowest of the two internal nodes 16 and 17. If node 17 is low (corresponding to "0" state) before the write operation, the right side of memory cell 12 will be off. When $\overline{RD}$ voltage is lowered, the voltage at bit line 15 will drop until memory cell 12 bit line emitter begins to conduct current to sink 13. This will cause the right side of memory cell 12 to turn on which will turn off the left side. In this manner the state of memory cell 12 is altered. When the voltage at node 16 is lower than the voltage at node 17 by sufficient margin, the write operation can be terminated and memory cell 12 will in time recover to the full differential voltage corresponding to the altered stable binary state. The write operation is terminated by raising voltage $\overline{RD}$ back to the read threshold voltage.

Write recovery time is defined as the time delay between the termination of the write signal, $\overline{RD}$ in this example, and the appearance of stable correct data at the output buffer. If memory cell 12 has not recovered such that node 17 voltage is higher than the read threshold voltage when the write operation is terminated, memory cell 12 will exhibit extended write recovery time. In this case two things will happen. First, when voltage $\overline{RD}$ is raised, the parasitic capacitance of bit line 15 will be charged through transistor 25 which will cause a transient current to flow through transistor 27 and to sense amplifier 22 that corresponds to the opposite state of the data written. Second, when voltage $\overline{RD}$ reaches the read threshold voltage, since the voltage at node 17 is still lower than the read threshold, transistor 25 will continue to conduct the current from current sink 13. In this case both transistors 24 and 25 are conducting and the voltage differential at sense amplifier 22 is small with an indeterminate polarity. Until memory cell 12 recovers (node 17 is higher than the read threshold) a correct stable state will not appear at the output. Once memory cell 12 recovers, the correct data will propagate to the output. In this manner the write recovery time will be a function of the time duration of the write pulse width in relation to the speed of writing into memory cell 12 including the speed of recovering to a readable level.

Memory cells which have slow writing characteristics such as the cross coupled SCR cell are frequently used because of their higher immunity to noise such as current transients caused by alpha particles. Although these cells exhibit reduced soft error rate they have the characteristic of longer write time and longer write recovery time.

It is therefore desirable to eliminate write recovery time and have correct, stable data available at the RAM output before the write and after the write is terminated, for all circuit conditions including the case when a short write time is used to write a slow writing memory cell.

SUMMARY OF THE INVENTION

Objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

To achieve the objects, and in accordance with the purposes of the invention as embodied and broadly described herein, a bipolar random access memory is provided, comprising at least one pair of bit lines; at least one memory cell connected between the pair of bit lnnes, with the at least one memory cell having a first memory state and a second memory state; first means for selectively shifting the state of the at least one memory cell, during a write operation, between the first and second memory states, thereby charging one of the bit lines to a high voltage level; second means coupled to the bit lines for selectively sensing the memory state of the at least one memory cell and storing the memory state; third means for setting the second means to store the memory state to which the at least one memory cell is being shifted, the third means completing the setting during the write operation and prior to charging of the one bit line by operation of the first means sufficient to set the second means; and a read/write transmission circuit for isolating the second means from the bit lines and for charging the one bit line independent of the charging by operation of the first means, the read/write transmission circuit beginning operation during the data write operation and ending operation after the voltage of the one bit line has been raised to a predetermined threshold level.

BRIEF DESCRIPTION OF THE DRAWINGS

The accompanying drawings, which are incorporated in and constitute a part of the specification, illustrate preferred embodiments of the invention and, together with the general description given above and the detailed description of the preferred embodiment given below, serve to explain the principles of the invention.

DESCRIPTION OF THE PREFERRED EMBODIMENT

Reference will now be made in detail to the present preferred embodiments of the invention as illustrated in the accompanying drawings.

Figure 1:
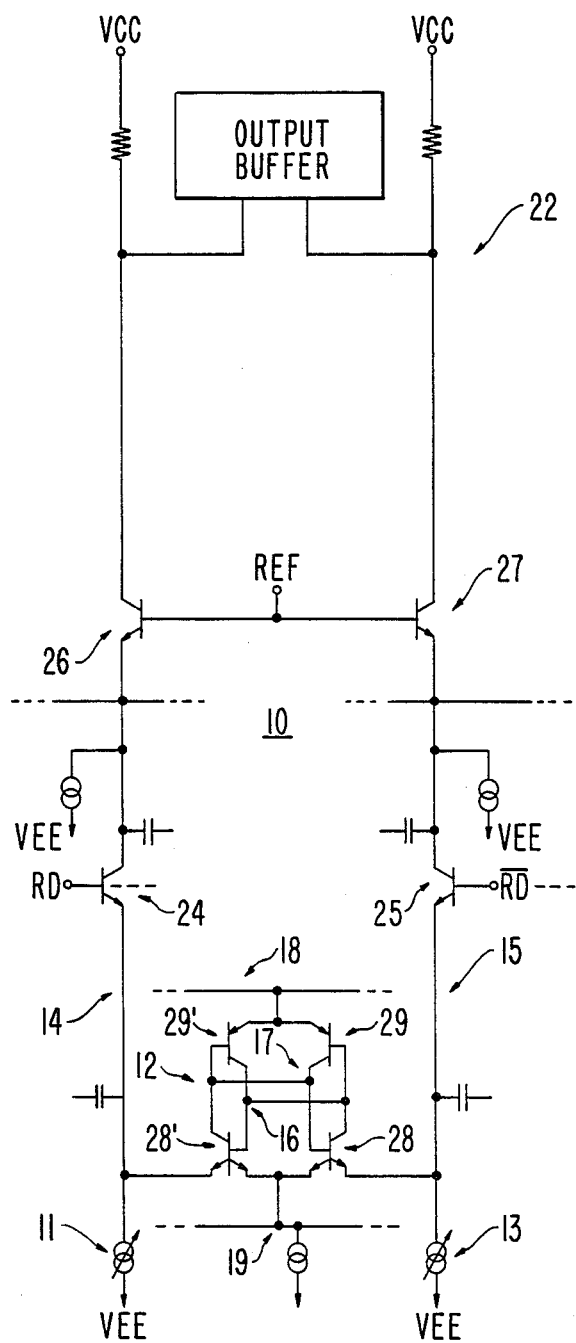
FIG. 1 is a circuit diagram of a prior art bipolar RAM.
Figure 2:
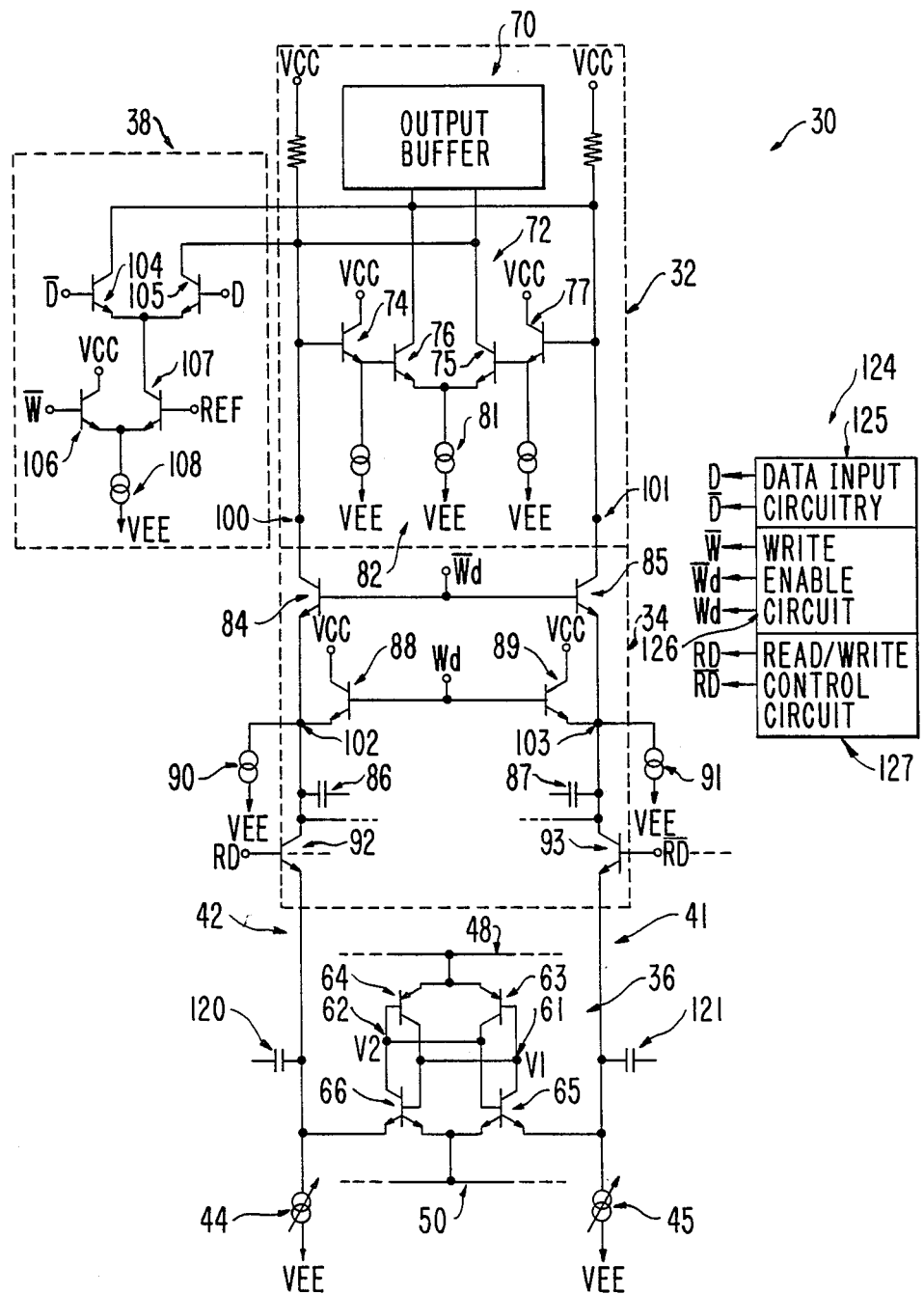
FIG. 2 is a circuit diagram of a first embodiment of the invention in which a bipolar RAM has a data bypass, a sense latch and a read/write transmission circuit.

A preferred embodiment of a bipolar RAM according to the invention is shown in FIG. 2 and is represented generally by the numeral 30. RAM 30 comprises a plurality of memory cells, represented by memory cell 36; bit lines 41 and 42; read/write transmission circuit 34; sense amplifier 32; data bypass 38; and sense latch 72.

Memory cell 36 connects to each bit line 41, 42, as well as an upper word line 48 and a lower word line 50. Each bit line terminates in a current sink 44 and 45, respectively, at one end, and read/write transmission circuit 34 at the other end. Sense latch 72 is part of sense amplifier 32. Data bypass 38 connects to sense latch 72, and connects to sense amplifier 32 and read/write transmission circuit 34 at nodes 100 and 101 at the collectors of transistors 84 and 85, respectively.

In an actual RAM employing the circuit of FIG. 2, there would be several pairs of bit lines, each pair having a plurality of memory cells, all connected to a single sense amplifier. In the preferred embodiments of the invention, there are 4 sense amplifiers per RAM, 16 pairs of bit lines for each sense amplifier, and 64 memory cells per pair of bit lines. The following discussion is limited to a single sense amplifier with a pair of bit lines and a single memory cell; however, this discussion is equally applicable to a plurality of sense amplifiers, bit lines, and memory cells.

Memory cell 36 comprises transistors that function as two interconnected silicon controlled rectifiers (SCRs). One SCR comprises transistors 63 and 65, and the other SCR comprises transistors 64 and 66. Transistors 65 and 66 are shown with two emitters, which is a shorthand representation of two transistors connected with common bases and common collectors. Node 61 connects the bases of transistors 63 and 66 to the collectors of transistors 64 and 65. Node 62 connects the bases of transistors 64 and 65 to the collectors of transistors 63 and 66. Node 61 or node 62 is established at a higher voltage than the other node by writing to memory cell 36. This establishes memory cell 36 in one of two possible memory states, where node 61 voltage V1 is at high level and node 62 voltage V2 is at a low level (a first memory state), or where V2 is high and V1 is low (a second memory state). Lower word line 50 is connected to a current sink to provide standby current to memory cell 36 to maintain its memory state when not selected. When V1 is at a high voltage level, bit line 42 will be at a high voltage level and bit line 41 will be at a low voltage level. When V2 is at a high voltage level, bit line 41 is at a high voltage level and bit line 42 is at a low voltage level. The bit line at a high voltage level, or in transit to a high voltage level following a data write operation, is called a high level bit line.

Sense amplifier 32 comprises an output buffer 70 and a sense latch 72. Sense amplifier 32 is connected to VCC by two resistors which connect to nodes 100 and 101. Data bypass 38 connects to nodes 100 and 101, the output of sense latch 72, and the input of output buffer 70. The input side of sense latch 72 connects to nodes 100 and 101, and the output side cross connects to sense amplifier output buffer 70 and nodes 101 and 100. Sense amplifier 32 senses the memory state of selected memory cell 36 by the voltages at nodes 100 and 101 during a read operation and couples the sensed memory state to external devices via output buffer 70 as shown in FIG. 2. Nodes 100 and 101 can also be designed to connect to an additional amplifier and then to output buffer 70. Sense latch 72, comprising transistors 74–77 and three current sinks represented generally by the numeral 82, latches, or stores, the state of selected memory cell 36 as sensed by the voltages at nodes 100 and 101, set by data bypass 38 during a data write operation or set by transistors 84 and 85 during a data read operation.

Parasitic capacitances 86 and 87 arise at the collector of read/write transistor 93 on one side and the collector of read/write transistor 92 on the other side. These capacitances result from the interconnection of multiple pairs of bit lines with multiple read/write transistors. Transistors 84 and 85 are connected in a cascade arrangement with transistors 92 and 93 to provide faster switching operation in the presence of parasitic capacitances 86 and 87. Current sinks 90 and 91 are "keep alive" current sinks. When transistors 88, 84 and 92, or 85, 89 and 93, are turned off, nodes 102 and 103 at the emitters of transistors 88 and 89, respectively, would be floating at no predetermined voltage level. Current sinks 90 and 91 define the voltage at nodes 102 and 103 and prevent the nodes from floating.

Data bypass circuit 38 operates during a write operation and comprises four transistors 104–107 and current sink 108. As information is being written to selected memory cell 36, that same information is provided to data bypass 38 from data input circuit 125, part of a conventional input circuit 124 that supplies read and write control signals for RAM 30. Data bypass 38 sets sense latch 72 of sense amplifier 32 to the state corresponding to the state being set in memory cell 36. The advantage of data bypass 38 and sense latch 72 is that sense amplifier 32 is set immediately to a new memory state of selected memory cell 36 without waiting for memory cell 36 to recover from the write operation, thereby making the state to which memory cell 36 is being set immediately available to external circuits.

Signals $\overline{D}$ and D, supplied to transistors 104 and 105 by data input circuit 125, correspond to the information being written to memory cell 36. Signal $\overline{W}$, applied to the base of transistor 106 by write enable circuit 126, initiates the data write operation from data bypass 38 to sense latch 72.

Connecting a large number of memory cells to each bit line causes parasitic bit line capacitances, represented by capacitors 120 and 121. At the completion of a data write operation, when read/write signal RD or $\overline{RD}$, to be discussed in more detail hereinbelow, rises to a read threshold level, memory cell voltages may have not reached their steady state values because of the time required for memory cell nodes 61 or 62, as appropriate, to reach steady state voltage level. At this point, a large current, called a transient write recovery current, will be generated, at the collectors of transistors 92 or 93. If transistors 84 or 85 were allowed to conduct the transient current caused by charging the parasitic capacitance of the high level bit line, this transient write recovery current could reset sense latch 72 to an erroneous state.

Read/write transmission circuit 34 isolates sense amplifier 32 from the bit lines of selected memory cell 36 during a data write operation and diverts the transient write recovery current away from sense latch 72. The isolation begins at the start of the data write operation and ends after the voltage of the high level bit line has been raised to a predetermined level.

As embodied herein and presented by way of an example and not as a limitation to the specific device disclosed, read/write transmission circuit 34 consists of transistors 84, 85, 88, 89, 92, and 93, and write enable circuit 126.

Read/write transmission circuit 34 diverts the transient write recovery current to VCC through transistors 88 or 89 and prevents the transient write recovery current from affecting sense latch 72 by turning off transistors 84 and 85. At the completion of the charging of the bit line parasitic capacitance, read/write transmission circuit 34 reconnects sense amplifier 32 to bit lines 41 and 42 by turning on transistors 84 and 85. At this point any transient currents should be low enough that the state of sense latch 72 will not be altered. Once selected memory cell 36 fully recovers from the write operation, the state of the sense latch is reinforced by memory cell 36.

During a write operation, transistors 84 and 85, controlled by signal $\overline{Wd}$, isolate sense amplifier 32 from bit lines 41 and 42. Transistors 88 and 89, controlled by signal Wd from write enable circuit 126, are lined up to provide a current path from VCC to bit lines 41 and 42 via transistors 92 and 93, respectively, to charge parasitic capacitance 120 or 121, as appropriate to the data being written. Either transistor 92 or 93 is switched by RD or $\overline{RD}$, controlled by read/write control circuit 127, to write data to memory cell 36.

Figure 3:
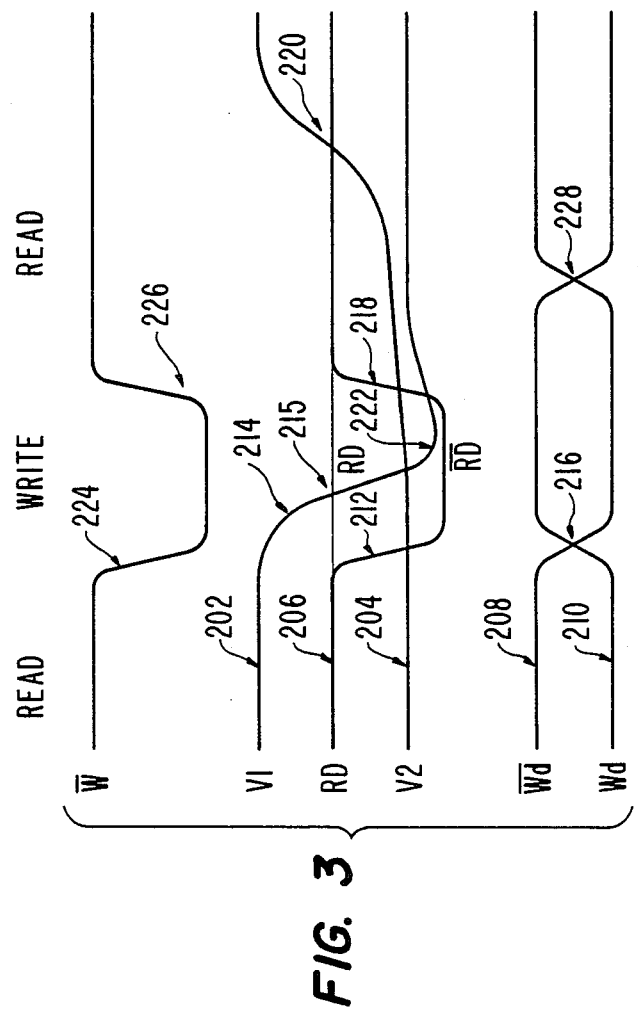
FIG. 3 is a timing diagram of the control signals of the RAMs of FIG. 2 and FIG. 4.

Turning now to the detailed operation of the circuit of FIG. 2, and in particular to a data read operation, assume that memory cell 36 is in a state where node 61 (V1) is at a high voltage and node 62 (V2) is at a low voltage, as shown by points 202 and 204 on lines representing V1 and V2 of FIG. 3. Signals RD and $\overline{RD}$ at the bases of transistors 92 and 93 of FIG. 2 are set to a voltage level intermediate between the voltage at nodes 61 and 62 by read/write control circuit 127, as shown by point 206 on line RD of FIG. 3. Word line 48 of memory cell 36 is selected by a row decoder (not shown), part of conventional address input circuitry. Current sources 44 and 45 are switched on to bit lines 42 and 41 by multiplexers (not shown). Signal $\overline{Wd}$ is at a high voltage level, and Wd is at a low voltage level, as shown at points 208 and 210 on lines representing Wd and $\overline{Wd}$ of FIG. 3. This turns on transistors 84 and 85 and turns off transistors 88 and 89.

Since V1 is high, transistors 64 and 66 conduct current from upper word line 48 through bit line 42 to current sink 44. Bit line 42 is therefore at a high voltage level, and while V1 remains higher than RD, transistor 92 is turned off, transistor 84 is held on by "keep alive" current source 90, and node 100 is at a high voltage level relative to node 101. Voltage V2 is low, therefore transistors 63 and 65 are off and bit line 41 is at a low voltage level. Transistor 93 is turned on and supplies current source 45, and node 101 is therefore at a low voltage level. The state of memory cell 36 selected by word line 48 and bit lines 41 and 42 is sensed at nodes 100 and 101 of sense amplifier 32 and is coupled to output buffer 70.

When memory cell 36 is in its second state, where V2 is high and V1 is low, RAM 30 functions in a similar manner to put node 101 at a high voltage and node 100 at a low voltage so that sense amplifier 32 and output buffer 70 reflect the second memory state of memory cell 36.

A write operation to memory cell 36 can involve either shifting the state of memory cell 36 from one state to another, for example, from V1 at a high voltage level and V2 at a low voltage level to V2 at a high voltage level and V1 at a low voltage level, or not shifting the state of memory cell 36. The latter situation occurs when memory cell 36 is already in the state representing the data to be written to the cell, and no shift of state is necessary.

Assume for initial conditions that V1 is at a high voltage level and that V2 is at a low voltage level, transistors 66 and 64 are on, and transistors 63 and 65 are off. The state of memory cell 36 is then shifted by read/write control circuit 127 dropping signal $\overline{RD}$ to a low level, turning on transistor 65 to supply current sink 45, which lowers voltage V1, turns off transistor 66 and turns on transistor 63. This raises voltage V2 and puts memory cell 36 into a second memory state.

To accomplish this shift of state, word line 48 and bit lines 41 and 42 are selected as previously described for a read or write operation. RD and $\overline{RD}$ are initially set to a voltage intermediate between V1 and V2 as shown by points 202, 204, and 206 on lines representing V1, V2, RD and $\overline{RD}$ of FIG. 3. $\overline{Wd}$ and Wd initially are set at a high voltage and a low voltage, points 208 and 210, respectively on lines representing $\overline{Wd}$ and Wd of FIG. 3, and will be discussed in more detail in conjunction with read/write transmission circuit 34, below. Voltage RD at the base of transistor 92 is held constant, and voltage $\overline{RD}$ at the base of transistor 93 is dropped to a low voltage to begin the write operation, as shown by point 212 on the line representing $\overline{RD}$ of FIG. 3. This shift of $\overline{RD}$ turns off transistor 93, causing bit line 41 voltage to drop until transistor 65 turns on, forcing V1 to drop, shown as point 214 on the line representing V1 of FIG. 3, turning off transistor 66 and turning on transistor 63. V2 rises slowly as memory cell 36 shifts to its new state, retarded by the response time of PNP transistors 63 and 64.

In accordance with the invention, a data bypass sets the sense amplifier to store the state to which the selected memory cell is being shifted. A preferred embodiment of data bypass 38 is shown in FIG. 2. At the start of the data write operation, signal $\overline{W}$ is reduced by write enable circuit 126 to a low voltage level, point 224 on the line representing $\overline{W}$ of FIG. 3, and the signals $\overline{D}$ and D are set by data input circuitry 125 to the memory state being set to memory cell 36. To be consistent with this example, D goes high and $\overline{D}$ is low. Transistor 106 turns off, transistor 107 turns on, biased by a reference voltage REF, transistor 105 turns on, and transistor 104 remains off.

In response to the signal from data bypass 38, node 100 goes low, if not already low, and node 101 goes high, if not already high, which corresponds to the state memory cell 36 will be in at the completion of the data write operation. Sense amplifier 32 at this point is isolated from the bit lines by transistors 84 and 85 which are turned off, as will be discussed in detail below. Sense latch transistor 76 shuts off, if not already off, holding the voltage at node 101 high, and sense latch transistor 75 turns on, if not already on, holding the voltage at node 100 low. At point 226, $\overline{W}$ goes high, turning on transistor 106 and turning off transistors 107 and 105. Sense latch 72 remains in the state set by data bypass 38.

Also in accordance with the invention, a read/write transmission circuit isolates sense amplifier 32 from bit lines 41 and 42 and provides charging current to the high level bit line. This transient write recovery current is diverted away from sense amplifier 32 at the end of the data write operation. In the preferred embodiment of FIG. 2, shown by way of example and not as a limitation, operation of read/write transmission circuit 34 is initiated by dropping the voltage level of $\overline{Ws}$ and raising Wd to a high voltage level, as shown by point 216 of FIG. 3. $\overline{Wd}$ and Wd are produced by write enable circuit 126. $\overline{RD}$, and RD are produced by read/write control circuit 12, which is part of conventional input circuit 124. The change of $\overline{Wd}$ and Wd must occur at about the same time as the write operation starts (i.e., $\overline{RD}$ drops to a low voltage).

When $\overline{Ws}$ goes low, transistors 84 and 85 are turned off, isolating sense amplifier 32 from bit lines 41 and 42. When Wd goes high, transistors 88 and 89 are turned on, providing a current path from VCC to bit lines 41 and 42. When V1 drops below RD at point 215 on the line representing V1 of FIG. 3, transistor 92 turns on, but has no effect on sense amplifier 32 because transistor 84 is off. After V1 drops to a minimum voltage sufficiently lower than V2, at point 222 on the line representing V1 of FIG. 3, $\overline{RD}$ is switched to a high voltage level at point 218 on the line representing $\overline{RD}$ of FIG. 3, terminating the data write operation and beginning the write recovery time period. V2 remains at a low level but is slowly rising when $\overline{RD}$ is switched high. When $\overline{RD}$ goes high, transistor 93 turns on and charges high level bit line 41 capacitance 121 using current from VCC diverted away from sense amplifier 32 through transistor 89. If sense amplifier 32 were not isolated from the bit lines by transistors 84 and 85 when $\overline{RD}$ went to a high voltage, the transient write recovery current would pass through transistor 85 and would rapidly lower the voltage at node 101 causing sense latch 72 to switch to an erroneous state. Transistor 93 turns on because voltage V2 is lower than $\overline{RD}$ (but rising).

Without the benefit of sense latch 72 and data bypass 38 of the present invention, both nodes 100 and 101 would be at a low voltage or at an indeterminate state, providing an erroneous output until voltage V2 exceeded RD at point 220 on the line representing V2 of FIG. 3. Without the benefit of read/write transmission circuit 34, the transient write recovery current would alter the state of sense latch 72.

At a time determined by the length of time needed to charge high level bit line parasitic capacitor 121, Wd is switched low and $\overline{Wd}$ is switched high, point 228 on the lines representing Wd and $\overline{Wd}$ of FIG. 3. This connects sense amplifier 32 to bit lines 41 and 42 by turning on transistors 84 and 85 and turning off transistors 88 and 89, terminating the diversion of current. Voltage $\overline{RD}$ is still greater than voltage V2, therefore transistor 93 remains turned on after $\overline{RD}$ goes high, but high level bit line 41 parasitic capacitance 121 has already been charged up. When $\overline{Wd}$ goes high, only a small transient current flows through transistors 84 and 85 because of a small change of voltage at the emitters of transistors 84

(V3) and 85 (V4). Transistors 84 and 88 are connected in an OR-TIE, as are transistors 85 and 89. Signals $\overline{Wd}$ and Wd are differential signals, therefore the emitters of the OR-TIEd transistors remain high as $\overline{Ws}$ and Wd vary. If the emitter voltages change, they change very little and by the same amount at nodes 102 and 103. If parasitic capacitances 86 and 87 are represented by C1 and C2, respectively, where C1=C2, then, $$C1*dV3/dt = C2*dV4/dt.$$

This common noise will not affect the state of sense latch 72. In other words, the common noise is rejected.

Voltages at nodes 100 and 101 drop by approximately the same amount when transistors 84 and 85 turn on. Sense latch 72 retains its state because of current sink 81 connected to the emitters of transistors 75 and 76. After time 220, V2 exceeds $\overline{RD}$, turning off transistor 93, allowing memory cell 36 to reinforce sense latch 72.

The sense amplifier of the above described preferred embodiment of the invention reads the state of a selected memory cell by using current sensing. The currents transmitted through the bit lines set the voltage levels at nodes 100 and 101. In a second preferred embodiment of the invention, shown in FIG. 4 and represented generally by the numeral 300, sense amplifier 32 reads the state of selected memory cell 36 using voltage sensing by transistors 302 and 303 connected to bit lines 41 and 42, respectively.

RAM 300 comprises a plurality of memory cells, represented by memory cell 36; bit lines 41 and 42; read/write transmission circuit 34'; sense amplifier 32; data bypass 38'; and sense latch 72. Memory cell 36 connects to an upper word line 48, a lower word line 50, and bit lines 41, 42 is connected to a current sink, 44 and 45, respectively, at one end and read/write transmission circuit 34' at the other end. Read/write transmission circuit 34' connects to sense amplifier 32, data bypass 38', and sense latch 72 at nodes 100 and 101. Sense amplifier 32 comprises sense latch 72 and output buffer 70.

Figure 4:
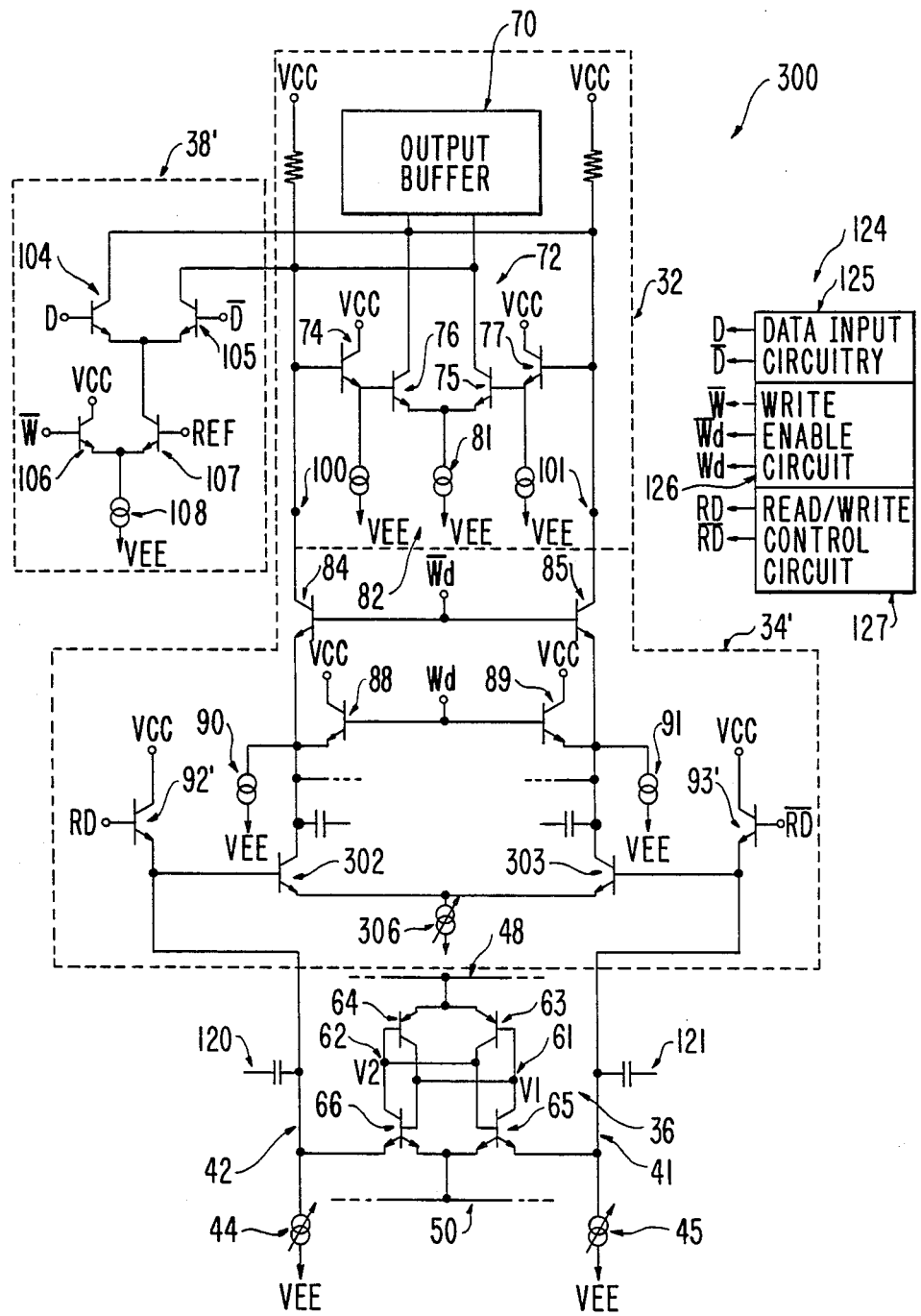
FIG. 4 is a circuit diagram of a second embodiment of the invention in which a bipolar RAM has a data bypass, a sense latch and a read/write transmission circuit.

As in the first preferred embodiment, an actual RAM employing the circuit of FIG. 4 would include several pairs of bit lines, each pair having a plurality of memory cells, all connected to a single sense amplifier.

Memory cell 36, sense amplifier 32, and data bypass 38' of the second preferred embodiment comprise the same elements as the corresponding devices in the first preferred embodiment and operate in the same manner with one exception. Signal D, which was connected to the base of transistor 105 in the first preferred embodiment shown in FIG. 2, is now connected to transistor 104. Signal $\overline{D}$, which was connected to the base of transistor 104 in the first embodiment, is now connected to transistor 105 in data bypass 38'. Elements in FIG. 4 identical to elements in FIG. 2 are identified by the same numerals.

In the second preferred embodiment, read/write transmission circuit 34' performs the same connection, isolation and charging functions as read/write transmission circuit 34 of the first preferred embodiment, but has a different configuration and operates in a slightly different manner. As embodied herein and presented by way of an example and not as a limitation to the specific device disclosed, read/write transmission circuit 34' comprises transistors 84, 85, 88, 89, 92', 93', 302, and 303 and current sink 306.

The base of bit line voltage sensing transistor 303 connects to bit line 41 and the base of bit line voltage sensing transistor 302 connects to bit line 42. The emitters of transistors 302 and 303 are both connected to current sink 306. The collectors of transistors 302 and 303 connect to the emitters of transistors 84 and 88 and transistors 85 and 89 respectively.

During a write operation when Wd is high and $\overline{Wd}$ is low, transistors 88 and 89 are on and transistors 84 and 85 are off. This isolates sense latch 72 from bit lines 41 and 42.

Turning now to the operation of the circuit of FIG. 4, and in particular to a data read operation, assume that memory cell 36 is in a state where node 61 voltage (V1) is at a high level and node 62 voltage (V2) is at a low level, as shown by points 202 and 204 on the lines representing V1 and V2 of FIG. 3. Signals RD and $\overline{RD}$ at the bases of transistors 92' and 93' of FIG. 4 are set by read/write control circuit 127, to a voltage level intermediate between the voltage at nodes 61 and 62, as shown by point 206 on the line representing RD and $\overline{RD}$ of FIG. 3. Word line 48 of memory cell 36 is selected by a row decoder (not shown) and is set to a high voltage level, and current sinks 44 and 45 are switched on to bit lines 42 and 41 by multiplexers (not shown). Signal $\overline{Wd}$ is at a high voltage level, and Wd is at a low voltage level, as shown at points 208 and 210 on lines representing $\overline{Wd}$ and Wd of FIG. 3. This turns on transistors 84 and 85 and turns off transistors 88 and 89.

Since V1 is high, transistors 64 and 66 conduct from upper word line 48 through bit line 42 to supply current sink 44. Bit line 42 is therefore at a high voltage level, and while V1 remains higher than RD, transistor 92' is turned off, transistor 302 is turned on, transistor 84 is turned on, and node 100 is at a low voltage level. In contrast, node 100 of the first preferred embodiment would have been at a high voltage when V1 was high, but voltage sensing transistors 302 and 303 reverse the state of sense amplifier nodes 100 and 101 in the second preferred embodiment in response to voltages V1 and V2 of selected memory cell 36. Voltage V2 is low, therefore transistors 63 and 65 are off and bit line 41 is at a low voltage level. Transistor 93' is turned on, transistor 303 is turned off, transistor 85 conducts only keep alive current to sink 91, and node 101 is therefore at a high voltage level. The state of memory cell 36 is therefore sensed at nodes 100 and 101 of sense amplifier 32 and is coupled to output buffer 70.

When memory cell 36 is in its second state, where V2 is high and V1 is low, RAM circuit 300 functions in a similar manner to put node 101 at a low voltage and node 100 at a high voltage so that sense amplifier 32 and output buffer 70 reflect the second memory state of memory cell 36.

A write operation to memory cell 36 can involve either shifting the state of the memory cell from one state to another, for example, from V1 at a high voltage level and V2 at a low voltage level to V2 at a high voltage level and V1 at a low voltage level, or not shifting the state of memory cell 36. The latter situation occurs when memory cell 36 is already in the memory state representing the data to be written, and no shift of memory state is necessary.

Assume for initial conditions that V1 is at a high voltage level and that V2 is at a low voltage level. The state of memory cell 36 is then shifted in the same manner as in the first preferred embodiment.

To accomplish this shift of state, word line 48 and bit lines 41 and 42 are selected as previously described for a read or write operation. RD and $\overline{\text{RD}}$ are initially set by read/write control circuit 127 to a voltage intermediate between V1 and V2 as shown by points 202, 204, and 206 on the lines representing V1, V2, RD and $\overline{\text{RD}}$, respectively, of FIG. 3. $\overline{\text{Wd}}$ and Wd initially are set at a high voltage and a low voltage, points 208 and 210 on the lines representing $\overline{\text{Wd}}$ and Wd of FIG. 3, respectively, and will be discussed in more detail in conjunction with read/write transmission circuit 34', below. Voltage RD at the base of transistor 92' is held constant, and voltage $\overline{\text{RD}}$ at the base of transistor 93' is dropped to a low voltage by read/write control circuit 127 to begin the write operation, as shown by point 212 on the line representing $\overline{\text{RD}}$ of FIG. 3. This shift of $\overline{\text{RD}}$ turns off transistor 93', causing transistor 65 to turn on, forcing V1 to drop, shown as point 214 on the line representing V1 of FIG. 3, shutting off transistor 66. V2 rises slowly as memory cell 36 shifts to its new state, retarded by the switching time of PNP transistors 63 and 64.

As in the first preferred embodiment, a data bypass 38' sets sense amplifier 32 to store the state to which selected memory cell 36 is being shifted. A preferred embodiment of data bypass 38' is shown in FIG. 4. Data bypass 38' comprises transistor 104, which receives input signal D; transistor 105, which receives input signal $\overline{\text{D}}$; transistor 106 which receives input signal $\overline{\text{W}}$; transistor 107 which receives a reference voltage, and current sink 108. Signals D and $\overline{\text{D}}$ are set by data input circuitry 125, and $\overline{\text{W}}$ is set by write enable circuit 126.

At the start of the data write operation, signal $\overline{\text{W}}$ is reduced to a low voltage level, point 224 on the line representing $\overline{\text{W}}$ of FIG. 3, and signals $\overline{\text{D}}$ and D are set to the state to which selected memory cell 36 is being set. To be consistent with this example, D is high and $\overline{\text{D}}$ is low. Transistor 106 turns off, transistor 107, biased by a reference voltage REF, turns on, transistor 104 turns on, and transistor 105 remains off.

In response to the signal from data bypass 38', node 100 is forced high and node 101 is forced low, which corresponds to the state the selected memory cell 36 will be in at the completion of the data write operation. Sense amplifier 32 at this point is isolated from bit lines 41 and 42 by transistors 84 and 85 being off, as will be discussed in detail below. Sense latch transistor 76 turns on, if not already on, holding the voltage at node 101 low, and sense latch transistor 75 turns off, if not already off, holding the voltage at node 100 high. At point 226 on the line representing $\overline{\text{W}}$ of FIG. 3, $\overline{\text{W}}$ goes high turning on transistor 106 and turning off transistors 107 and 104. Sense latch 72 remains in the state just set by data bypass 38'.

Read/write transmission circuit 34' isolates sense amplifier 32 from bit lines 41 and 42. If sense amplifier 32 were not de-coupled from bit lines 41 and 42 at the start of the write operation, when $\overline{\text{RD}}$ goes low at point 212 on the line representing $\overline{\text{RD}}$ of FIG. 3, V1 is high and V2 is low which would force node 100 low and node 101 high. This is opposite to the state to which data bypass 38' is attempting to set sense latch 72. To prevent an erroneous resulting sense latch state, read/write transmission circuit 34' must isolate sense amplifier 32 at the beginning of the write cycle, at point 216 on the lines representing Wd and $\overline{\text{Wd}}$ of FIG. 3. In the second preferred embodiment, shown by way of example and not as a limitation to the specific device shown, operation of read/write transmission circuit 34' is initiated by dropping the voltage level of $\overline{\text{Wd}}$ and raising Wd to a high voltage level, as shown by point 216 on the lines representing Wd and $\overline{\text{Wd}}$ of FIG. 3. $\overline{\text{Wd}}$ and Wd are produced by write enable circuit 126.

When $\overline{\text{Wd}}$ goes low and Wd goes high, transistors 84 and 85 are turned off, isolating sense amplifier 32 from voltage sensing transistors 302 and 303. Transistors 88 and 89 are turned on, conducting the collector currents of transistors 302 and 303 to supply current to current sink 306. After V1 is lower than V2 with sufficient margin at point 222 on the line representing V1 of FIG. 3, $\overline{\text{RD}}$ is switched to a high voltage level at point 218 on the line representing RD of FIG. 3 terminating the data write operation and beginning the write recovery time period. V2 remains at a low level but is slowly rising at point 218, therefore when $\overline{\text{RD}}$ goes high, transistor 93' turns on and charges the high level bit line 41 parasitic capacitance 121. Transistor 93' turns on because voltage V2 is lower than $\overline{\text{RD}}$ (but rising). At this point, both transistors 92' and 93' are on and the voltages on bit lines 41 and 42 are approximately equal. Transistors 302 and 303 share the current from sink 306 by approximately equal amounts.

At a time determined by the length of time needed to charge high level bit line parasitic capacitor 121, Wd is switched low and $\overline{\text{Wd}}$ is switched high, point 228 on the lines representing Wd and $\overline{\text{Wd}}$ of FIG. 3. This connects sense amplifier 32 to bit lines 41 and 42 by turning on transistors 84 and 85 and turning off transistors 88 and 89. By point 228 on the lines representing Wd and $\overline{\text{Wd}}$ of FIG. 3, both transistors 302 and 303 are carrying the same current, both transistors 84 and 85 are carrying the same current, and the voltages at nodes 100 and 101 drop by the same amount, but the differential voltage is maintained by sense latch current sink 81. When $\overline{\text{Wd}}$ goes high only a small transient current is generated because of a small change in the voltages V3 and V4 at the emitters of transistors 84 and 85. Transistors 84 and 88 are connected in an OR-TIE, as are transistors 85 and 89. Signals $\overline{\text{Wd}}$ and Wd are differential signals, therefore the emitters of the OR-TIEd transistors remain high as $\overline{\text{Wd}}$ and Wd vary. If the emitter voltages change, they change very little and by the same amount. If parasitic capacitances 86 and 87 are represented by C1 and C2, respectively, where C1 equals C2 then:

$$C1*dV3/dt = C2*dV4/dt,$$

This common noise will not affect the state of sense latch 72. In other words, the common noise is rejected.

After point 220 on the line representing V2 of FIG. 3, V2 exceeds $\overline{\text{RD}}$, turning off transistors 93' and 302, switching all of sink 306 to transistor 303. This raises the voltage at node 100 and lowers the voltage at node 101, which increases the difference between nodes 100 and 101, maintaining the state of sense latch 72.

As is apparent from the above discussion, a bipolar RAM incorporating the present invention has no write recovery time. The data being written to the memory cell is immediately available to external circuits and is protected from transient write recovery currents that could produce erroneous outputs while th memory cell is changing state.

Additional advantages and modifications will readily occur to those skilled in the art. The invention in its broader aspects is, therefore, not limited to the specific details, representative apparatus and illustrative example shown and described. Accordingly, departures may be made from such details without departing from the spirit or scope of applicants' general inventive concept.

What is claimed is:

1. A bipolar random access memory, comprising:
   (a) at least one pair of bit lines;
   (b) at least one memory cell connected between said pair of bit lines, with said at least one memory cell having a first memory state and a second memory state;
   (c) first means for selectively shifting said memory state of said at least one memory cell, during a write operation, between said first and second memory states, thereby charging one of said bit lines to a high voltage level;
   (d) second means coupled to said bit lines for selectively sensing said memory state of said at least one memory cell and storing said memory state;
   (e) third means for setting said second means to store said memory state to which said at least one memory cell is being shifted, said third means completing said setting during said write operation and prior to charging of said one bit line by operation of said first means sufficient to set said second means; and
   (f) a read/write transmission circuit for isolating said second means from at least one of said bit lines and for charging said one bit line independent of said charging by operation of said first means, said read/write transmission circuit beginning operation during said data write operation and ending operation after the voltage of said one bit line has been raised to a predetermined threshold level.

2. The bipolar random access memory of claim 1 wherein said second means includes means for sensing the current on said bit lines.

3. The bipolar random access memory of claim 1 wherein said second means includes means for sensing the voltage of said bit lines.

4. The bipolar random access memory of claim 1 wherein said second means contains a sense latch responsive to said third means, for storing the state to which said at least one memory cell is being shifted.

5. A method of storing data in a random access memory having at least one bipolar memory cell coupled to a pair of bit lines comprising:
   (a) selectively shifting the memory state of the bipolar memory cell, during a write operation, between a first and a second memory state, thereby charging one of said bit lines to a high voltage level;
   (b) selectively sensing the memory state of said bipolar memory cell and storing said sensed memory state in a sense latch;
   (c) setting said stored memory state, at the start of said write operation, to the memory state to which said bipolar memory cell is being shifted;
   (d) isolating, beginning at the start of said write operation, said sense latch from at least one of the bit lines;
   (e) charging, beginning at the end of said write operation, said one bit line independent of said step of selectively shifting; and
   (f) terminating said isolating and said charging when the voltage of said one bit line has been raised to a predetermined threshold level.

6. The method of storing data of claim 5 wherein said step of sensing includes sensing the current on the bit lines.

7. The method of storing data of claim 5 wherein said step of sensing includes sensing the voltage of the bit lines.

* * * * *